FAST-ACTING TOGGLE CIRCUIT

Filed Nov. 23, 1971

United States Patent Office 3,712,990

Patented Jan. 23, 1973

3,712,990

FAST-ACTING TOGGLE CIRCUIT

Colin C. Gordon, Cincinnati, Ohio, assignor to General Motors Corporation, Detroit, Mich.

Filed Nov. 23, 1971, Ser. No. 201,472
Int. Cl. H03k 5/20, 5/08
U.S. Cl. 307—235 3 Claims

ABSTRACT OF THE DISCLOSURE

A toggle circuit includes a differential switch for shifting to a full-switched condition when the potential at an input terminal exceeds the potential at a reference terminal. The potential at the input terminal is clamped to the potential at a control terminal through the base-emitter junction of an emitter-follower transistor. In turn, potential at the reference terminal through the anode-cathode junction of an ordinary diode. As a result, the differential switch normally resides in a half-switched condition thereby to minimize the switching time of the toggle circuit. Further, as the differential switch begins to shift from the half-switched condition toward the full-switched condition, the potential at the control terminal is removed. Consequently, the potential at the reference terminal decreases thereby to reduce the switching time of the toggle circuit.

DISCLOSURE

This invention relates to a switching circuit. More particularly, the invention relates to a toggle circuit including a differential switch for shifting to a full-switched condition when the potential at an input terminal exceeds the potential at a referenec terminal.

According to one aspect of the invention, a potential is normally applied to a control terminal. An emitter-follower transistor clamps the potential at the input terminal below the potential at the control terminal by an amount equal to the base-emitter junction voltage of the transistor. In turn, an ordinary diode clamps the potential at the control terminal above the potential at the reference terminal by an amount equal to the anode-cathode junction voltage of the diode. Assuming the base-emitter junction voltage of the transistor equals the anode-cathode junction voltage of the diode, the potential at the input terminal equals the potential at the reference terminal. As a result, the differential switch normally resides in a half-switched condition thereby to minimize the switching time of the toggle circuit.

In another aspect of the invention, the potential at the control terminal is removed as the differential switch begins to shift from the half-switched condition toward the full-switched condition. In the absence of a potential at the control terminal, the diode is reverse biased to terminate the flow of current from the control terminal to the reference terminal through the diode. Consequently, the potential at the reference terminal decreases with respect to the potential at the input terminal thereby to reduce the switching time of the toggle circuit.

These and other aspects and advantages of the invention may be best understood by reference to the following detail description of a preferred embodiment when considered in conjunction with the accompanying drawing.

Figure 1:
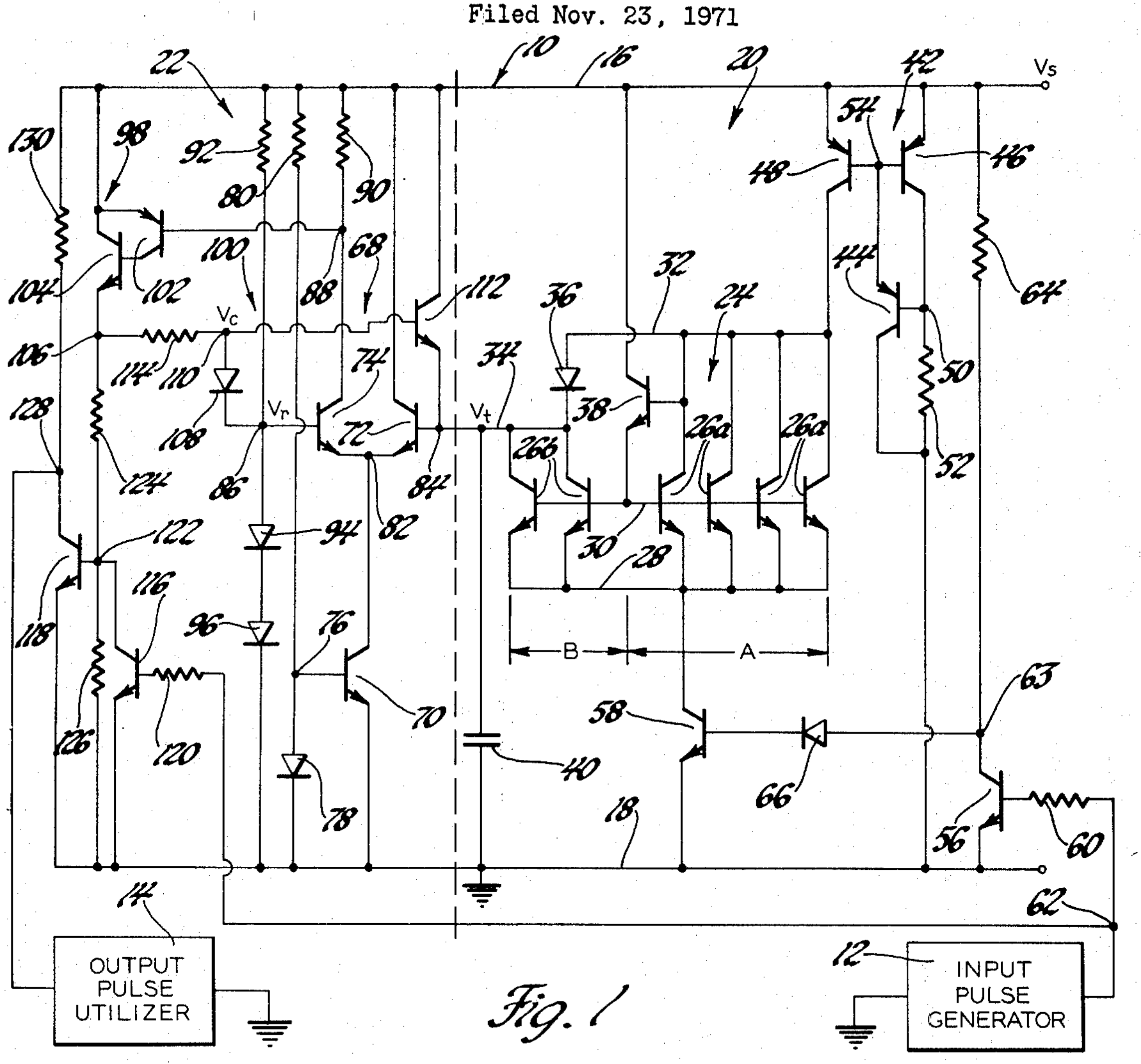
FIG. 1 is a schematic diagram of a pulse length multiplier circuit which includes a toggle circuit incorporating the invention.
Figure 2:
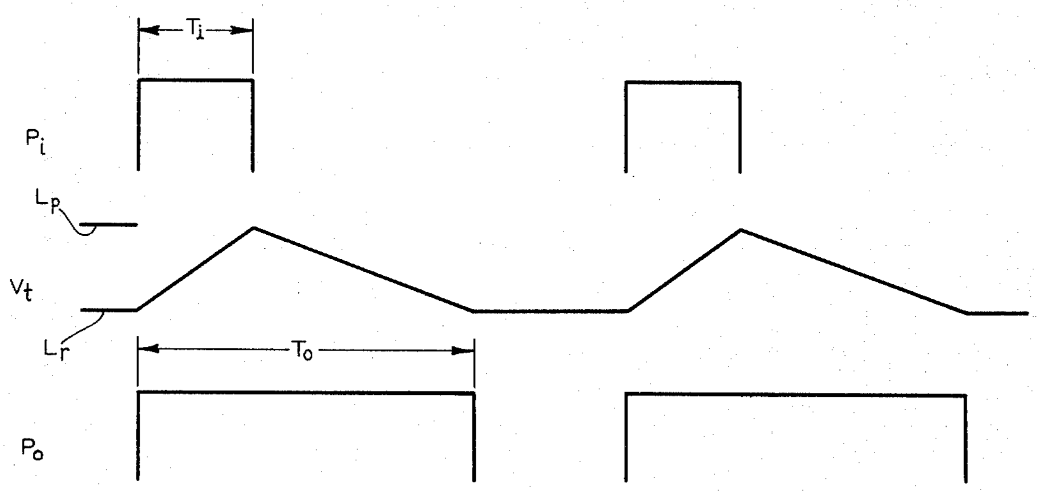
FIG. 2 is a graphic diagram of several waveforms useful in explaining the operation of the pulse length multiplier circuit.

Referring to FIGS. 1 and 2, a pulse length multiplier circuit 10 is connected between an input pulse generator 12 and an output pulse utilizer 14. The input pulse generator 12 develops input pulses $P_i$ each having a length $T_i$ defined in response to a given input function. For example, the input pulse generator 12 may be an electronic fuel controller for producing input pulses $P_i$ each having a length $T_i$ determined as a function of at least one operating parameter of an internal combustion engine. The multiplier circuit 10 receives the input pulses $P_i$ from the input pulse generator 12, develops an output pulse $P_o$ in response to each input pulse $P_i$, and applies the output pulses $P_o$ to the output pulse utilizer 14. The output pulses $P_o$ each have a length $T_o$ given by the equation $$(1) \qquad T_o=(MF)T_i$$

where MF is a multiplication factor. Thus, the length $T_o$ of the output pulses $P_o$ is equal to the length $T_i$ of the input pulses $P_i$ multiplied by the multiplication factor MF. The output pulse utilizer 14 performs a given output function in response to the length $T_o$ of the output pulses $P_o$. For example, the output pulse utilizer 14 may be an electronic fuel injector for applying fuel to an internal combustion engine at a constant rate over the length $T_o$ of each of the output pulses $P_o$.

Referring to FIG. 1, the pulse length multiplier circuit 10 includes a high potential line or supply line 16 and a low potential line or ground line 18 between which a direct current supply voltage $V_s$ is applied by a power source (not shown). More particularly, the pulse length multiplier circuit 10 includes a timing circuit 20 and a toggle circuit 22. The timing circuit 20 includes a timing network 24 featuring a series of timing transistors 26 all of the NPN juncton type. The timing transistors 26 have matched transistor characteristics. Preferably, the timing transistors 26 are simultaneously fabricated through the use of integrated circuit processing techniques so that the individual transistor characteristics of the transistors 26 are as nearly identical as possible. The series of transistors 26 is divided into a first set A containing N number of transistors 26$_a$ and a second set B containing M number of transistors 26$_b$. As illustrated, $N=4$ and $M=2$.

The low potential electrodes or the emitter electrodes of the transistors 26$_a$ and 26$_b$ are each connected to a common low potential node or common emitter line 28. The medium potential electrodes or the base electrodes of the transistors 26$_a$ and 26$_b$ are each connected to a common medium potential node or common base line 30. The high potential electrodes or the collector electrodes of the transistor 26$_a$ are each connected to a first common high potential node or first common collector line 32. The high potential electrodes or the collector electrodes of the transistor 26$_b$ are each connected to a second common high potential node or second common collector line 34.

A steering diode 36 is connected between the first common collector line 32 and the second common collector line 34. Specifically, the anode electrode of the diode 36 is connected to the first common collector line 32. The cathode electrode of the diode 36 is connected to the second common collector line 34. Further, a bias transistor 38 is connected in an emitter-follower configuration between the first common collector line 32 and the common base line 30. The biasing transistor 38 is of the NPN junction type. In particular, the base electrode of the transistor 38 is connected directly to the first common collector line 32. The emitter electrode of the transistor 38 is connected directly to the common base line 30. The collector electrode of the transistor 38 is connected directly to the high potential line 16.

A capacitor 40 is connected between the second common collector line 34 and the low potential line 18 for developing a timing voltage $V_t$ thereacross on the second common collector line 34. In a manner which will be more fully described later, the amplitude of the timing voltage $V_t$ is normally maintained at a reference level $L_r$ as shown in FIG. 2.

A constant current source 42 includes a pilot transistor 44 and a pair of drive transistors 46 and 48 all of the PNP junction type. The base electrode of the transistor 44 is connected directly to a junction 50. A biasing resistor 52 is connected between the junction 50 and the low potential line 18. The collector electrode of the transistor 44 is connected directly to the low potential line 18. The emitter electrode of the transistor 44 is connected directly to a junction 54 located between the base electrodes of the transistors 46 and 48. The emitter electrodes of the transistors 46 and 48 are connected directly to the high potential line 16. The collector electrode of the transistor 46 is connected directly to the junction 50. The collector electrode of the transistor 48 is connected directly to the first common collector line 32 in the timing network 24.

In operation, the pilot transistor 44 is rendered conductive in a constant current mode in response to the biasing action of the resistor 52. With the transistor 44 conductive, a pilot current is drawn from the junction 54. This pilot current provides a base current for rendering the transistors 46 and 48 conductive in a constant current mode. With the transistor 46 conductive, a holding current is applied to the junction 50 to maintain the pilot transistor 44 conductive. With the transistor 48 conductive, a constant supply current $I_s$ is applied to the first common collector line 32. The magnitude of the supply current $I_s$ is equal to the magnitude of the holding current applied to the junction 50. In turn, the magnitude of the holding current is determined by the magnitude of the pilot current drawn from the junction 54. The magnitude of the pilot current is defined by the value of the resistor 52. Hence, the value of the resistor 52 regulates the magnitude of the supply current $I_s$.

In addition, the timing circuit 20 includes an input transistor 56 and a control transistor 58 both of the NPN junction type. An input resistor 60 is connected between an input terminal 62 and the base electrode of the transistor 56. The input terminal 62 is connected directly to the input pulse generator 12. The emitter electrode of the transistor 56 is connected directly to the low potential line 18. The collector electrode of the transistor 56 is connected directly to a junction 63. A biasing resistor 64 is connected between the junction 63 and the high potential line 16. A turn off diode 66 is connected between the junction 63 and the base electrode of the transistor 58. The emitter electrode of the transistor 58 is connected directly to the low potential line 18. The collector electrode of the transistor 58 is connected directly to the common emitter line 28 in the timing network 24.

Referring to FIGS. 1 and 2, when an input pulse $P_i$ is initiated at the input terminal 62, the transistor 56 is rendered fully conductive through the biasing action of the resistor 60. With the transistor 56 turned on, the transistor 58 is rendered fully nonconductive through the biasing action of the transistor 56 and the diode 66. With the transistor 58 turned off, the common emitter line 28 is effectively disconnected from the low potential line 18. In this condition, the N number of transistors $26_a$ in the set A and the M number of transistors $26_b$ in the set B are rendered fully nonconductive. With the transistors $26_a$ in the set A turned off, the potential on the first common collector line 32 rises above the potential on the second common collector line 34 so that the steering diode 36 is forward biased. With the diode 36 turned on, a charging current $I_c$ is applied through the diode 36 to the second common collector line 34 to charge the capacitor 40. The charging current $I_c$ is given by the equation $$I_c = I_s \qquad (2)$$

Hence, the charging current $I_c$ is equal to the supply current $I_s$. Under the influence of the charging current $I_c$, the timing voltage $V_t$ developed across the capacitor 40 increases from the reference level $L_r$. As the timing voltage $V_t$ increases on the second common collector line 34, the potential on the first common collector line 32 correspondingly rises to maintain the diode 36 turned on.

When an input pulse $P_i$ is terminated at the input terminal 62, the transistor 56 is rendered fully nonconductive. With the transistor 56 turned off, the transistor 58 is rendered fully conductive through the biasing action of the resistor 64 and the diode 66. With the transistor 58 turned on, the common emitter line 28 is effectively connected to the low potential line 18. In this condition, the N number of transistors $26_a$ in the set A and the M number of transistors $26_b$ in the set B are rendered conductive. With the transistors $26_a$ in the set A conductive, the potential on the first common collector line 32 drops below the potential on the second common collector line 34 so that the diode 36 is reverse biased. With the diode 36 turned off, the charging current $I_c$ is removed from the second common collector line 34. Thus, the charging current $I_c$ is applied to the capacitor 40 only in response to the presence of an input pulse $P_i$. As a result, the timing voltage $V_t$ increases from the reference level $L_r$ at the initiation of an input pulse $P_i$ to a peak level $L_p$ at the termination of an input pulse $P_i$. The peak level $L_p$ of the timing voltage $V_t$ is directly related to the length $T_i$ of the input pulse $P_i$.

As previously described, the transistors $26_a$ in the set A and the transistors $26_b$ in the set B are turned on in response to the termination of an input pulse $P_i$. Since the transistors $26_a$ and $26_b$ have matched transistor characteristics, the transistors $26_a$ and $26_b$ each draw an equal control current $I_k$ when rendered conductive. The magnitude of the control current $I_k$ is dependent upon the magnitude of the bias current applied to the common base line 30 by the bias transistor 38. The magnitude of the bias current is directly proportional to the magnitude of the potential on the first common collector line 32 to which the base electrode of the emitter-follower transistor 38 is connected. In turn, the magnitude of the potential on the first common collector line 32 is inversely related to the combined magnitude of the control currents $I_k$ drawn from the first common collector line 32 by the N number of transistors $26_a$ in the set A.

At the termination of an input pulse $P_i$, the potential on the first common collector line 32 drops to an equilibrium level at which the combined magnitude of the control currents $I_k$ drawn from the first common collector line 32 by the N number of transistors $26_a$ in the set A is equal to the magnitude of the supply current $I_S$ applied to the first common collector line 32 by the current source 42. In other words, the potential on the first common collector line 32 stabilizes at a level at which the magnitude of the bias current applied to the common base line 30 by the bias transistor 38 is such that each of the transistors $26_a$ in the set A draws a control current $I_k$ given by the equation $$I_k = \frac{I_S}{N} \qquad (3)$$

Thus, the control current $I_k$ is equal to the supply current $I_S$ divided by the number N of transistors $26_a$ in the set A. In addition, the bias transistor 38 draws a base current out of the first common collector line 32. However, the magnitude of this base current is so small that its effect on the operation of the transistors $26_a$ in the set A is negligible.

At the common base line 30, the transistors $26_b$ in the set B are subjected to the same bias current as the transistors $26_a$ in the set A. Since the individual transistor characteristics of the transistors $26_b$ match the individual transistor characteristics of the transistors $26_a$, each of the transistors $26_b$ in the set B draws the control current $I_k$ from the second common collector line 34.

Together, the M number of transistors $26_b$ in the set B draws a discharging current $I_d$ from the second common collector line 34 to discharge the capacitor 40. The discharging current $I_d$ is given by the equation $$I_d=(M)I_k \quad (4)$$

Hence, the discharging current $I_d$ is equal to the control current $I_k$ multiplied by the number M of the transistors $26_b$ in the set B. Further, the simultaneous solution of the equations (3) and (4) for the discharging current $I_d$ yields the equation $$I_d=\frac{M}{N} I_s \quad (5)$$

Thus, the discharging current $I_d$ is equal to the supply current $I_S$ multiplied by the ratio of the number M of the transistors $26_b$ in the set B to the number N of the transistors $26_a$ in the set A. Under the influence of the discharging current $I_d$, the timing voltage $V_t$ developed across the capacitor 40 decreases from the peak level $L_p$ to the reference level $L_r$.

In a manner to be more fully described later, the toggle circuit 22 produces an output pulse $P_o$ in response to each input pulse $P_i$. Specifically, an output pulse $P_o$ is initiated in coincidence with the initial departure of the timing voltage $V_t$ from the reference level $L_r$ and is terminated in coincidence with the subsequent arrival of the timing voltage $V_t$ back at the reference level $L_r$. As previously indicated by the Equation 1, the length $T_o$ of the output pulse $P_o$ is equal to the length $T_i$ of the input pulse $P_i$ multiplied by a multiplication factor MF. The multiplication factor MF is given by the equation $$MF=1+\frac{I_c}{I_d} \quad (6)$$

The simultaneous solution of the Equations 2, 5 and 6 for the multiplication factor MF yields the equation $$MF=1+\frac{N}{M} \quad (7)$$

Hence, the multiplication factor MF is equal to one plus the ratio of the number N of transistors $26_a$ in the set A to the number M of transistors $26_b$ in the set B. In the illustrated embodiment of the pulse length multiplier circuit 10, $N=4$ and $M=2$ so that the multiplication factor $MF=3$. However, it will be readily understood that the numbers N and M may assume any values necessary to produce a particular multiplication factor MF. Where the desired multiplication factor MF is a whole integer, it is convenient if the number M is one and the number N is one less than the desired multiplication factor MF.

Inspection of the Equation 7 indicates that the multiplication factor MF is completely independent of variations in the capacitance of the capacitor 40 and in the magnitude of the supply current $I_S$, especially variations produced by changes in ambient temperature. Moreover, since the transistors $26_a$ and $26_b$ have matched transistor characteristics, the multiplication factor MF is also independent of variations in these transistor characteristics due to fluctuations in ambient temperature. That is, changes in ambient temperature will effect each of the transistors $26_a$ and $26_b$ in exactly the same manner. As a result the multiplication factor MF is completely stable with fluctuations in ambient temperature.

The toggle circuit 22 includes a differential switch 68 having a sink transistor 70 and a pair of switching transistors 72 and 74 all of the NPN junction type. The base electrode of the transistor 70 is connected directly to a junction 76. A reference diode 78 is connected between the junction 76 and the low potential line 18. A biasing resistor 80 is connected between the junction 76 and the high potential line 16. The emitter electrode of the transistor 70 is connected directly to the low potential line 18. The collector electrode of the transistor 70 is connected directly to a junction 82 located between the emitter electrodes of the transistors 72 and 74. The base electrode of the transistor 72 is connected directly to an input junction 84 on the second common collector line 34 of the timing network 24. The base electrode of the transistor 74 is connected directly to a reference junction 86. The collector electrode of the transistor 72 is connected directly to the high potential line 16. The collector electrode of the transistor 74 is connected directly to a junction 88. A biasing resistor 90 is connected between the junction 88 and the high potential line 16. A biasing resistor 92 is connected between the junction 86 and the high potential line 16. A pair of reference diodes 94 and 96 are connected in series between the junction 86 and the low potential line 18.

Further, the toggle circuit 22 includes a buffer switch 98 and a clamping network 100. The buffer switch 98 includes a pilot transistor 102 of the PNP junction type and a drive transistor 104 of the NPN junction type. The base electrode of the transistor 102 is connected directly to the junction 88. The emitter electrode of the transistor 102 and the collector electrode of the transistor 104 are connected together to the high potential line 16. The collector electrode of the transistor 102 is connected directly to the base electrode of the transistor 104. The emitter electrode of the transistor 104 is connected to a junction 106. The clamping network 100 includes a clamping diode 108 connected between a clamping junction 110 and the reference junction 86 and includes a clamping transistor 112 connected in an emitter-follower configuration between the clamping junction 110 and the input junction 84. Specifically, the anode electrode of the diode 108 is connected directly to the clamping junction 110. The cathode electrode of the diode 108 is connected directly to the reference junction 86. The base electrode of the transistor 112 is connected directly to the clamping junction 110. The emitter electrode of the transistor 112 is connected directly to the input junction 84. The collector electrode of the transistor 112 is connected directly to the high potential line 16. A clamping resistor 114 is connected between the junction 106 and the junction 110.

In addition, the toggle circuit 22 includes an input transistor 116 and an output transistor 118 both of the NPN junction type. A biasing resistor 120 is connected between base electrode of the input transistor 116 and the input terminal 62. The emitter electrode of the transistor 116 is connected directly to the low potential line 18. The collector electrode of the transistor 116 is connected directly to a junction 122. A biasing resistor 124 is connected between the junction 106 and the junction 122. A biasing resistor 126 is connected between the junction and the low potential line 18. The base electrode of the transistor 118 is connected directly to the junction 122. The emitter electrode of the transistor 118 is connected directly to the low potential line 18. The collector electrode of the transistor 118 is connected directly to an output terminal 128. A biasing resistor 130 is connected between the output terminal 128 and the high potential line 16. The output pulse utilizer 14 is connected directly to the output terminal 128.

The diffrential switch 68 is operable between a half-switched state and a full-switched state. When the potential at the input junction 84 equals the potential at the reference junction 86, the differential switch 68 shifts to the half-switched state. When the potential at the input junction 84 exceeds the potential at the reference junction 86, the differential switch 68 shifts to the full-switched state. Specifically, the sink transistor 70 is rendered fully conductive in a constant current mode through the biasing action of the diode 78 in conjunction with the resistor 80. Thus, the transistor 70 provides a constant current sink at the junction 82 for the switching transistors 72 and 74. In the half-switched state of the differential switch 68, the transistors 72 and 74 are rendered equally conductive or placed in a partially conductive condition. In the full-switched state of the differential switch 68, the transistor 72 is rendered fully conductive or placed in a fully conductive condition while the transistor 74 is rendered fully nonconductive or placed in a fully nonconductive condition.

The timing voltage $V_t$ is applied as an input voltage to the input terminal 84 by the timing circuit 20. As previously described, the amplitude of the timing voltage $V_t$ alternately increases and decreases between the reference level $L_r$ and the peak level $L_p$. Hence, the potential at the input terminal 84 follows the amplitude of the timing voltage $V_t$ between the reference level $L_r$ and the peak level $L_p$. On the other hand, a reference voltage $V_r$ is developed at the reference terminal 86 by the reference resistor 92 in conjunction with the reference diodes 94 and 96. In particular, the resistor 92 applies a reference current to the reference terminal 86 to forward bias the diodes 94 and 96 into saturation. As a result, the amplitude of the reference voltage $V_r$ is substantially constant at a reference level $L_r$ defined by the sum of the characteristic junction voltage drops of the diodes 94 and 96.

Normally, the differential switch 68 is maintained in the half-switched state so that the transistors 72 and 74 are in the partially conductive condition. With the transistor 74 turned on, the transistors 102 and 104 in the buffer switch 98 are rendered fully conductive through the biasing action of the transistors 70 and 74. With the transistors 102 and 104 turned on, the clamping resistor 114 applies a clamping voltage $V_c$ to the clamping terminal 110. The clamping diode 108 is forward biased in response to the application of the clamping voltage $V_c$ to the clamping terminal 110. Hence, the amplitude of the clamping voltage $V_c$ is clamped above the amplitude of the reference voltage $V_r$ by an amount equal to the characteristic anode-cathode junction voltage drop of the diode 108. That is, the potential at the clamping terminal 110 is equal to the potential at the reference terminal 86 plus the characteristic voltage drop across the anode-cathode junction of the diode 108.

The clamping transistor 112 is also forward biased in response to the application of the clamping voltage $V_c$ to the clamping terminal 110. With the transistor 112 turned on, the timing voltage $V_t$ at the input terminal 84 is clamped below the amplitude of the clamping voltage $V_c$ at the terminal 110 by an amount equal to the characteristic base-emitter junction voltage drop of the transistor 112. That is, the potential at the input terminal 84 equals the potential at the clamping terminal 110 less the characteristic voltage drop across the base-emitter emitter junction of the transistor 112. Ordinarily, the forward biased anode-cathode junction voltage drop of the diode 108 is substantially identical to the forward biased base-emitter junction voltage drop of the transistor 112. This is especially so where both the diode 108 and the transistor 112 are simultaneously fabricated through the use of integrated circuit processing techniques. Since the characteristic base-emitter junction voltage drop of the transistor 112 is substantially identical to the characteristic anode-cathode junction voltage drop of the diode 108, the amplitdue of the timing voltage $V_t$ at the input junction 84 is substantially identical to the amplitude of the reference voltage $V_r$ at the reference junction 86. In other words, both the timing voltage $V_t$ and the reference voltage $V_r$ are defined at the reference level $L_r$. Accordingly, the differential switch 68 is maintained in the half-switched condition.

Further, with the diode 108 and the transistor 112 turned on, a clamping current is applied through the the clamping resistor 114 to the clamping junction 112. Substantially all of the clamping current flows across the anode-cathode junction of the diode 108. Only a relatively small portion of the clamping current flows across the base-emitter junction of the transistor 112. The application of the clamping current from the clamping terminal 110 through the diode 108 to the reference terminal 86 produces a slight increase in the amplitude of the reference voltage $V_r$.

As previously described, the reference diodes 94 and 96 are forward biased into saturation. In this condition, the characteristic junction voltage drops of the diodes 94 and 96 tend to remain relatively constant regardless of the amount of current applied through the diodes 94 and 96. However, this saturated voltage-current relationship is not perfect or absolute. Even when the diodes 94 and 96 are biased into saturation, a substantial increase in the total current passed through the diodes 94 and 96 will produce a slight increase in the characteristic junction voltage drops developed across the diodes 94 and 96.

With the differential switch 68 in the half-switched state, the total current applied through the reference diodes 94 and 96 comprises the reference current developed through the resistor 92 and the clamping current developed through the resistor 114. The application of the reference current alone to the terminal 86 is sufficient to saturate the diodes 94 and 96 thereby to nominally define the amplitude of the reference voltage $V_r$. The added application of the clamping current through the diode 108 to the junction 86 serves to raise the amplitude of the reference voltage $V_r$ slightly above the nominal potential otherwise defined in response to the reference current alone. The significance of this slight rise in the amplitude of the reference voltage $V_r$ will become more apparent later.

When an input pulse $P_i$ is initiated at the input terminal 62, the input transistor 116 is rendered fully conductive through the biasing action of the resistor 120. With the transistor 116 turned on, the output transistor 118 is rendered fully nonconductive through the biasing action of the transistor 116. With the transistor 118 turned off, an output pulse $P_o$ is initiated at the output terminal 128. Thus, an output pulse $P_o$ is initiated at the output terminal 128 in response to initiation of an input pulse $P_i$ at the input terminal 62. Or, put another way, an output pulse $P_o$ is initiated coincident with the departure of the timing voltage $V_t$ from the reference level $L_r$. The amplitude of the output pulse $P_o$ is primarily defined by the supply voltage on the high potential line 16.

Moreover, in response to the initiation of an input pulse $P_i$, the amplitude of the timing voltage $V_t$ increases from the reference level $L_r$ toward the peak level $L_p$. As the potential at the input junction 84 exceeds the potential at the reference junction 86, the differential switch 68 shifts from the half-switched state to the full-switched state. Specifically, the transistor 72 shifts from the partially conductive condition to the fully conductive condition while the transistor 74 shifts from the partially conductive condition to the fully nonconductive condition. The switching time of the differential switch 68 may be defined as the elapsed time period between the departure of the differential switch 68 from the half-switched state until the arrival of the differential switch 68 in the full-switched state. This switching time is less than the switching time required for the differential switch 68 to shift from a full-switched state in which the transistor 72 is in a fully nonconductive condition and the transistor 74 is in a fully conductive condition to the full-switched state in which the transistor 72 is in the fully conductive condition and the transistor 74 is in the fully nonconductive condition. Therefore, the maintenance of the differential switch 68 in the half-switched state minimizes the switching time of the differential switch 68.

As previously described, the transistor 74 shifts from the partially conductive condition toward the fully nonconductive condition as the differential switch 68 shifts from the half-switched state toward the full-switched state. As the transistor 74 is turned off, the transistors 102 and 104 in the buffer switch 98 are rendered fully nonconductive. As the transistors 102 and 104 are turned off, the clamping voltage $V_c$ is removed from the clamping junction 110. With the clamping voltage $V_c$ absent from the clamping junction 110, the clamping transistor 112 is rendered fully nonconductive. With the transistor 112 turned off, the timing voltage $V_t$ at the input junction 84 is completely unclamped.

Moreover, with the clamping voltage $V_c$ removed from the clamping junction 110, the clamping current previously developed through the resistor 114 and applied to the reference junction 86 by the diode 108 is now removed from the reference junction 86. In the absence of the clamping current, the total current through the reference diodes 94 and 96 is defined solely by the reference current developed through the resistor 92. As a result, the amplitude of the reference voltage $V_r$ suddenly decreases with respect to the amplitude of the timing voltage $V_t$ thereby to provide a rapid increase in the potential at the input junction 84 with respect to the potential at the reference junction 86. The switching time of the differential switch 68 is inversely related to the rate of increase in the potential at the input junction 84 with respect to the potential at the reference junction 86. Consequently, this sudden decrease in the amplitude of the reference voltage $V_r$ with respect to the amplitude of the timing voltage $V_t$ further reduces the switching time of the differential switch 68 from the half-switched state to the full-switched state.

When an input pulse $P_i$ is terminated at the input junction 62, the input transistor 116 is rendered fully nonconductive through the biasing action of the resistor 120. However, the output transistor 118 remains turned off since the transistors 102 and 104 in the buffer switch 98 are turned on. Therefore, even though the input transistor 116 is turned off, the output transistor 118 remains turned off as long as the transistors 102 and 104 are turned off. Accordingly, an output pulse $P_o$ is maintained at the output junction 128.

As priorly set forth, the amplitude of the timing voltage $V_t$ reaches the peak level $L_p$ at the termination of an input pulse $P_i$. Immediately thereafter, the amplitude of the timing voltage decreases from the peak level $L_p$ toward the reference level $L_r$ as defined by the amplitude of the reference voltage $V_r$. As the amplitude of the timing voltage $V_t$ reaches the reference level $L_r$, the potential at the input junction 84 equals the potential at the reference junction 86. Consequently, the differential switch 68 shifts from the full-switched state toward the half-switched state. In particular, the transistor 72 shifts from the fully conductive condition to the partially conductive condition while the transistor 74 shifts from the fully nonconductive condition to the partially conductive condition. As the transistor 74 shifts toward the partially conductive condition, the transistors 102 and 104 in the buffer switch 98 are rendered fully conductive.

With the transistors 102 and 104 turned on, the clamping voltage $V_c$ is again applied to the clamping terminal 110 to forward bias the clamping diode 108 and the clamping transistor 112. With the clamping diode 108 turned on, the clamping current developed through the resistor 114 is again applied through the diode 108 to the reference terminal 86. In the manner previously described, the clamping current developed through the resistor 114 adds with the reference current developed through the resistor 92 to increase the total current through the reference diodes 94 and 96. As a result, the amplitude of the reference voltage $V_r$ suddenly increases with respect to the amplitude of the timing voltage $V_t$ thereby to reduce the switching time of the differential switch 68 from the full-switched state to the half-switched state. Moreover, with the transistor 112 turned on, the timing voltage $V_t$ is again clamped at the reference level $L_r$.

In addition, with the transistors 102 and 104 turned on in the buffer switch 98, the output transistor 118 is rendered fully conductive through the biasing action of the resistors 124 and 126. It will be noted that the input transistor 116 remains turned off. With the transistor 118 turned on, the output pulse $P_o$ is terminated at the junction 128. Thus, the output pulse $P_o$ is terminated coincident with the arrival of the timing voltage $V_t$ back at the reference level $L_r$. When an input pulse $P_i$ is next initiated at the input junction 62, the previously described operating cycle is repeated.

It will now be understood that the preferred embodiment of the invention is shown for illustrative purposes only. Accordingly, various alterations and modifications may be made to the preferred embodiment without departing from the spirit and scope of the invention.

What is claimed is:

1. A toggle circuit comprising: a differential switch having a reference terminal at which is developed a reference potential and having an input terminal at which is developed an input potential, the differential switch shifting to a half-switched state when the input potential is equal to the reference potential and shifting to a full-switched state when the input potential is different from the reference potential whereby the switching time required to shift the differential switch between the half-switched state and the full-switched state is minimized, means connected to the differential switch for applying a clamping potential to a clamping terminal as the differential switch shifts toward the half-switched state and for removing the clamping potential from the clamping terminal as the differential switch shifts toward the full-switched state; means including a clamping diode exhibiting a characteristic forward biased anode-cathode junction voltage, the diode connected between the clamping terminal and the reference terminal so that the diode is forward biased in response to the application of the clamping potential to clamp the clamping potential at a level which differs from the level of the reference potential in a first sense by an amount equal to the anode-cathode junction voltage of the diode; means including a clamping transistor exhibiting a characteristic forward biased base-emitter junction voltage which is substantially equal to the forward biased anode-cathode junction voltage of the clamping diode, the transistor connected in an emitter-follower configuration between the clamping terminal and the input terminal so that the transistor is forward biased in response to application of the clamping potential to clamp the input potential at a level which differs from the level of the clamping potential in a second sense by an amount equal to the base-emitter junction voltage of the transistor whereby the input potential is equal to the reference potential so as to maintain the differential switch in the half-switched state; and means connected to the input terminal for initially directing the input potential away from the reference potential to shift the differential switch to the full-switched state and for subsequently directing the input potential back to the reference potential to the differential switch to the half-switched state.

2. A toggle circuit comprising: a differential switch having an input terminal to which is applied an input voltage and having a reference terminal to which is applied a reference voltage, the differential switch shifting to a half-switched state when the amplitude of the input voltage equals the amplitude of the reference voltage and for shifting to a full-switched state when the amplitude of the input voltage exceeds the amplitude of the reference voltage thereby to minimize the switching time required to shift the differential switch between the half-switched state and the full-switched state; means connected to the differential switch for applying a clamping voltage to a clamping terminal as the differential switch shifts toward the half-switched state and for removing the clamping voltage from the clamping terminal as the differential switch shifts toward the full-switched state; means including a clamping diode having a characteristic forward biased anode-cathode junction voltage, the diode connected between the clamping terminal and the reference terminal so that the diode is forward biased in response to the application of the clamping voltage to increase the amplitude of the reference voltage relative to the amplitude of the input voltage thereby to decrease the switching time required to shift the differential switch to the half-switched state and to clamp the clamping voltage at an amplitude above the amplitude of the reference voltage by an amount equal to the anode-cathode junction voltage of the diode, and the diode connected between the clamping terminal and the reference terminal so that the diode is reverse biased in response to the removal of the clamping voltage to decrease the amplitude of the reference voltage relative to the amplitude of the input voltage thereby to decrease the switching time required to shift the differential switch to the full-switched state; means including a clamping transistor having a characteristic forward biased base-emitter junction voltage substantially equal to the characteristic forward biased anode-cathode junction voltage of the clamping diode, the transistor connected in an emitter-follower configuration between the clamping terminal and the input terminal so that the transistor is forward biased in response to the application of the clamping voltage to clamp the input voltage at an amplitude below the amplitude of the clamping voltage by an amount equal to the base-emitter junction voltage of the transistor whereby the amplitude of the input voltage equals the amplitude of the reference voltage so as to maintain the differential switch in the half-switched state; and means connected to the input terminal for initially increasing the amplitude of the input voltage away from the amplitude of the reference voltage to shift the differential switch to the full-switched state and for subsequently decreasing the amplitude of the input voltage back to the amplitude of the reference voltage to shift the differential switch to the half-switched state.

3. A toggle circuit comprising: a differential switch having an input terminal to which is applied an input voltage and having a reference terminal to which is applied a reference voltage, the differential switch shifting to half-switched state when the amplitude of the input voltage equals the amplitude of the reference voltage and for shifting to a full-switched state when the amplitude of the input voltage exceeds the amplitude of the reference voltage thereby to minimize the switching time required to shift the differential switch between the half-switched state and the full-switched state; means connected to the reference terminal for defining the amplitude of the reference voltage in direct relation to the total current applied to the reference terminal; means connected to the reference terminal for applying a biasing current to the reference terminal to define the amplitude of the reference voltage; means connected with the differential switch for applying a clamping voltage to a clamping terminal as the differential switch shifts toward the half-switched state and for removing the clamping voltage from the clamping terminal as the differential switch shifts toward the full-switched state; means including a clamping diode having a characteristic forward biased anode-cathode junction voltage, the diode connected between the clamping terminal and the reference terminal so that the diode is forward biased in response to the application of the clamping voltage to apply a clamping current to the reference terminal to increase the amplitude of the reference voltage relative to the amplitude of the input voltage thereby to decrease the switching time required to shift the differential switch to the half-switched state and to clamp the clamping voltage at an amplitude above the amplitude of the reference voltage by an amount equal to the anode-cathode junction voltage of the diode, and the diode connected between the clamping terminal and the reference terminal so tha the diode is reverse biased in response to the removal of the clamping voltage to remove the clamping current from the reference terminal to decrease the amplitude of the reference voltage relative to the amplitude of the input voltage thereby to decrease the switching time required to shift the differential switch to the full-switched state; means including a clamping transistor having a characteristic forward biased base-emitter junction voltage substantially equal to the characteristic forward biased anode-cathode junction voltage of the clamping diode, the transistor connected in an emitter-follower configuration between the clamping terminal and the input terminal so that the transistor is forward biased in response to the application of the clamping voltage to clamp the input voltage at an amplitude below the amplitude of the clamping voltage by an amount equal to the base-emitter junction voltage of the transistor whereby the amplitude of the input voltage equals the amplitude of the reference voltage so as to maintain the differential switch in the half-switched state; and means connected to the input terminal for initially increasing the amplitude of the input voltage away from the amplitude of the reference voltage to shift the differential switch to the full-switched state and for subsequently descreasing the amplitude of the input voltage back to the amplitude of the reference voltage to shift the differential switch to the half-switched state.

References Cited

UNITED STATES PATENTS

| | | | |
|---|---|---|---|
| 3,033,996 | 5/1962 | Atherton | 328—146 X |
| 3,041,471 | 6/1962 | Feissel | 307—280 X |
| 3,151,256 | 9/1964 | Simon et al. | 307—290 X |
| 3,181,004 | 4/1965 | Guckel | 307—290 X |

STANLEY D. MILLER, Jr., Primary Examiner

U.S. Cl. X.R.

307—237, 267; 328—146